(12) United States Patent
Hillmer et al.

(10) Patent No.: US 6,219,362 B1
(45) Date of Patent: Apr. 17, 2001

(54) METHOD FOR SYNTONIZING THE WAVE LENGTHS OF AN ARRANGEMENT OF OPTOELECTRONIC COMPONENTS

(75) Inventors: Hartmut Hillmer, Kassel; Bernd Klepser, Meiningen, both of (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/355,667
(22) PCT Filed: Nov. 12, 1998
(86) PCT No.: PCT/EP98/07253
§ 371 Date: Oct. 25, 1999
§ 102(e) Date: Oct. 25, 1999
(87) PCT Pub. No.: WO99/28999
PCT Pub. Date: Jun. 10, 1999

(30) Foreign Application Priority Data

Dec. 1, 1997 (DE) .............................. 197 55 453

(51) Int. Cl.⁷ ...................................... H01S 3/10
(52) U.S. Cl. .................. 372/20; 372/34; 372/45
(58) Field of Search .................. 372/20, 34, 43, 372/45, 50; 356/419

(56) References Cited

U.S. PATENT DOCUMENTS

| 5,469,265 | * 11/1995 | Measures et al. ............ 356/419 |
| 5,536,085 | 7/1996 | Li et al. ........................ 372/50 |
| 5,960,014 | * 9/1999 | Li et al. ........................ 372/20 |

FOREIGN PATENT DOCUMENTS

| 59-204292 | 11/1984 | (JP) . |
| 1 251686 | 10/1989 | (JP) . |

* cited by examiner

*Primary Examiner*—Leon Scott, Jr.
(74) *Attorney, Agent, or Firm*—Kenyon & Kenyon

(57) ABSTRACT

A method of wavelength tuning an opto-electronic component arrangement with at least two opto-electronic components is disclosed. The method includes the step of setting a characteristic wavelength for each opto-electronic component by selectively modifying a resistance of a conductor of a resistance heater and/or by selectively modifying a resistance of a resistor arrangement connected upstream from the resistance heater. The method, which minimizes costs, is aimed at wavelength tuning of semiconductor lasers, optical amplifiers, filters, wavelength multiplexers and optical fibers.

10 Claims, 19 Drawing Sheets

METHOD FOR SYNTONIZING THE WAVE LENGTHS OF AN ARRANGEMENT OF OPTOELECTRONIC COMPONENTS

FIELD OF THE INVENTION

The present invention relates to a method of tuning an opto-electronic component arrangement, which includes at least two opto-electronic components and at least one resistance heater having an electric conductor, assigned to the component, for setting the characteristic wavelength of the component.

BACKGROUND INFORMATION

Optical transmission systems are being increasingly used for data transmission and transmission of TV and radio channels. In general, such an optical transmission system includes an optical fiber, a semiconductor laser used as a light generator, and a light detector. The semiconductor laser emits light with a certain characteristic wavelength. This characteristic wavelength is basically dependent on the material used, but can be set within a certain wavelength range by the effect of heat, for example. In order to increase the amount of data that can be transmitted by an optical fiber, a plurality of semiconductor lasers associated with one optical fiber and operating at different wavelengths can be used. In this case, however, the wavelengths should be strictly observed, so that the data can be clearly differentiated at the end of the transmission.

The characteristic wavelength of semiconductor lasers varies within a tolerance range determined by the manufacturing technology; therefore, semiconductor lasers must be tuned prior to data transmission. For this purpose, devices known as resistance heaters are used, which change the characteristic wavelength of a semiconductor laser using a conductor mounted on a substrate by a thermal effect. Tuning is generally performed by setting the voltage applied to the electric conductor of the resistance heater, a voltage source being assigned in this case to each resistance heater.

A disadvantage of this method, however, is that it requires a very complex design. Furthermore, the arrangement cannot be tuned in a simple manner at a later time.

SUMMARY OF THE INVENTION

An object of the present invention is therefore to provide a method for tuning opto-electronic components that is simple and can be performed at any time.

A method according to the present invention is distinguished by the fact that the wavelength of at least one component is measured in a first step and the deviation from the desired wavelength is determined as a function of this value. Subsequently, in a second step, the resistance of the electric conductor, assigned to the respective component, of resistance heater H and/or the resistance of one of the resistor arrangements RM connected upstream from resistance heater H is changed as a function of the wavelength deviation determined. As the heating power of resistance heater H is modified in a controlled manner, the characteristic wavelength is modified as desired.

The method allows a plurality of opto-electronic components of a component arrangement, for example, a semiconductor laser array, to be tuned. In particular, the method can be performed fully automatically, which is very advantageous in large-scale use of opto-electronic components.

Changing the resistance of the electric conductor of resistance heater H by modifying the material, for example, by removing or applying precise amounts of material, is particularly advantageous.

DETAILED DESCRIPTION

Figure 1:
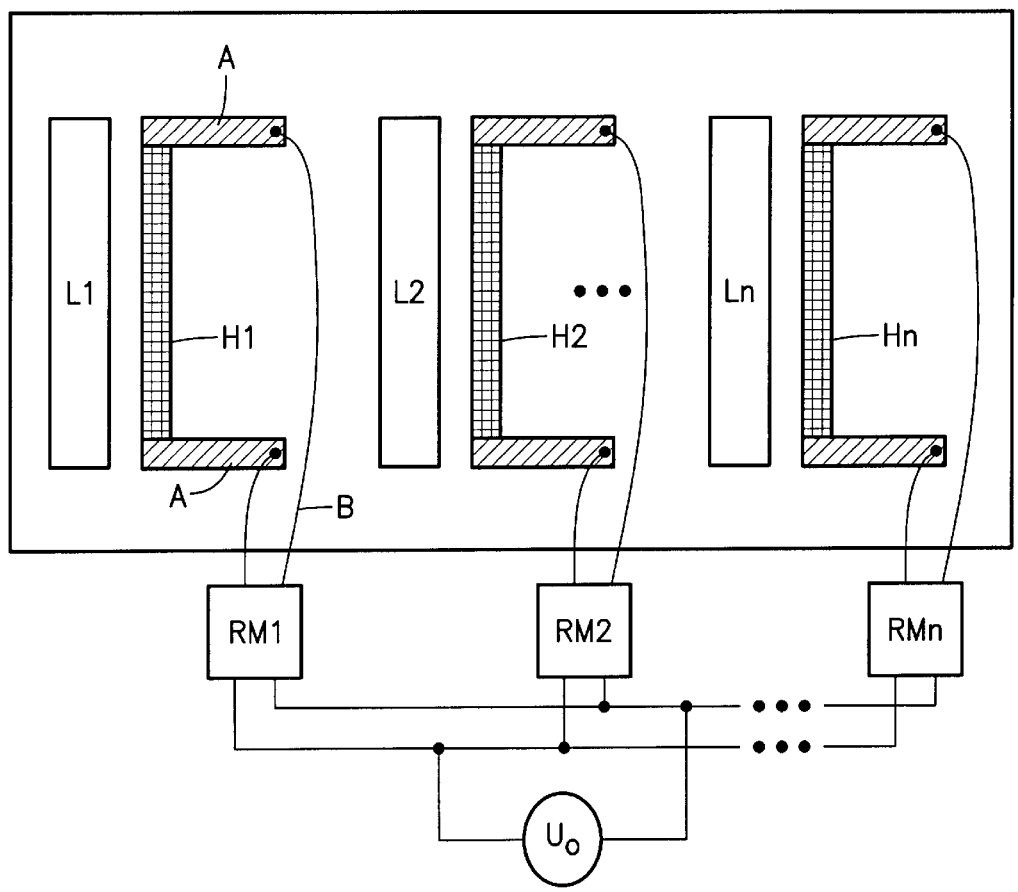
FIG. 1 shows a block diagram of an opto-electronic component arrangement according to the present invention.

FIG. 1 shows a component arrangement 1 including a number of semiconductor lasers L1 through Ln. The basic design of such a semiconductor laser array is known; therefore, it will not be described in greater detail here. Semiconductor lasers L1 through Ln operate at different wavelengths/frequencies for simultaneous data transmission in an optical data transmission system. Due to the technology used in their manufacture, semiconductor lasers L1 through Ln do not always emit at the desired wavelength. Therefore, they are tuned to the desired wavelength prior to and/or during first use by changing their characteristic wavelengths; in this case, the thermal effect is used for tuning. The characteristic wavelength can be varied within a certain range by individually subjecting semiconductor lasers L1 through Ln to a certain temperature. For this purpose at least one resistance heater H1–Hn is assigned to each semiconductor laser L1 through Ln. Resistance heaters H1–Hn each have an electric conductor (also referred hereinafter as a current conductor), have an appropriate electric resistance, develop heat when a voltage is applied to them, and generate the desired temperature field in semiconductor lasers L1 through Ln. Resistance heaters H1 through Hn are supplied with voltage, for example, indirectly via resistor arrangements RM1–RMn (FIG. 1), which are supplied from a common voltage supply $U_O$. Each of resistor arrangements RM1–RMn is preferably designed as a resistor array composed of individual resistor elements. Changing the overall resistance, for example, of resistor arrangement RM1, causes the heating power of resistance heater H1 to change. Thus the current flowing through resistance heater H1 also changes. Resistor arrangements RM1–RMn are set to certain resistance values electrically, optically and/or using electromagnetic waves.

Resistor arrangements, RM1–RMn can be arranged on a support carrying semiconductor lasers L1–Ln. Furthermore, resistor arrangements RM1–RMn can be provided separately from semiconductor lasers L1 through Ln, for example, at a location on the overall data transmission unit that is easy to access at a later time.

The voltage required for heating the current conductors of resistance heaters H1–Hn, supplied by voltage source $U_O$ is provided through power leads. For example, these power leads may be formed by areas A and bond connections B. Areas A are configured as connections and conductive areas, which are strictly speaking not resistors. The current conductors of resistance heaters H1–Hn have a number of multiply contiguous (in the mathematical sense) electrically conductive areas, which are electrically interconnected and have an overall resistance $R_H$. Depending on this resistance RH and the applied voltage $U_O$, each current conductor generates a heating power $P_H$, which affects the characteristic wavelength of semiconductor lasers L1–Ln.

To set the heating power of each resistance heater H1–Hn to a desired value, the voltage of voltage supply $U_O$ and/or resistance $R_H$ of the current conductors of resistance heaters H1–Hn can be modified.

In order to individually set the heating power of the individual resistance heaters H1–Hn, it is advantageous if their resistance $R_H$ is modified, since a change in the voltage also affects the heating power of all resistance heaters H1 through Hn.

According to the present invention, resistance $R_H$ is set by applying and/or removing material at certain points of the current conductor or uniformly along the current conductors of resistance heaters H1–Hn. Therefore, the cross section traversed by current can thus be increased and the electrical resistance can be reduced by applying conductive material. Conversely, the cross section traversed by current can be reduced and thus the electric resistance can be increased by removing material. For example, using a laser, material can be removed locally in a controlled manner. Of course, methods other than laser ablation are also contemplated by the present invention.

In addition to material application/removal, the current conductor cross section traversed by current can also be modified by modifying the current conductor material, for example, by mixing or unmixing materials. Once the material for the current conductor is appropriately selected, its resistance can be set by heating, cooling, chemical treatment, electrochemical treatment, particle implantation, electromagnetic radiation, and/or particle bombardment.

In addition to the spatial arrangement of the current conductor of resistance heaters H1–Hn and the modification of the resistances of the current conductors, resistors can also be connected to the power leads of the electric conductors of resistance heaters H1–Hn, which can be accomplished using resistor arrangements RM1–RMn.

Figure 2A:
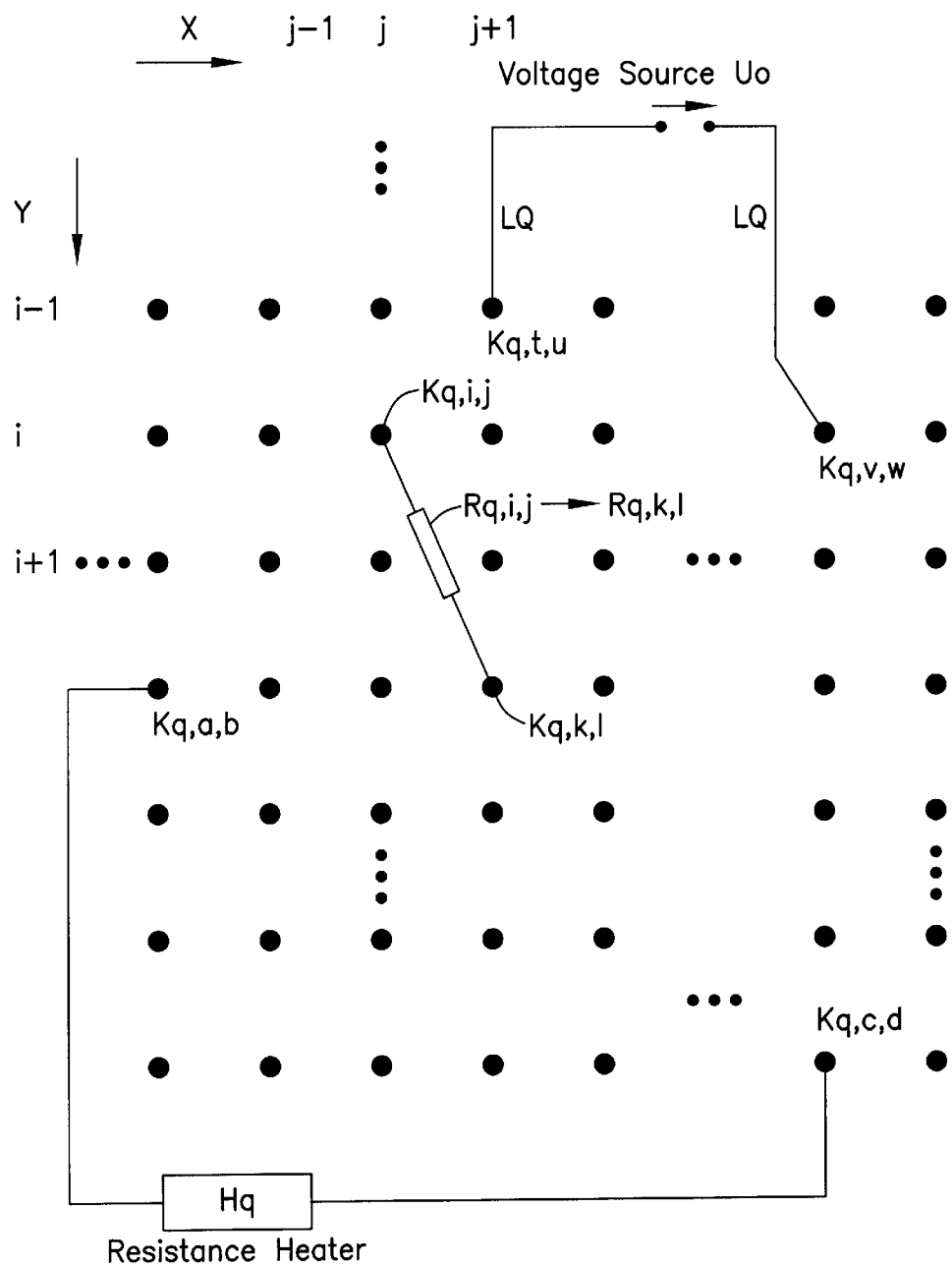
FIG. 2a schematically shows a matrix-type arrangement of a resistance device according to the present invention.

As mentioned previously, the characteristic wavelength $\lambda_q$ of each individual semiconductor laser can be individually set via the temperature of the respective semiconductor laser Lq and the heating power $P_H$, i.e., heating current $I_H$, via resistance heater Hq associated with semiconductor laser Lq. The principle of individually setting the heating current for each channel q, with q∈[1,n], can be implemented, for example, via a matrix-type arrangement as illustrated in FIG. 2a for channel q. The matrix-type arrangement includes contact fields $K_{q,i,j}$ with coordinates (i,j), where i∈[1,r] and j∈[1,s], q is the component number (channel), and r and s are the sizes of the matrix-type resistor arrangement in the y and x directions, respectively. Indices j and i denote column and row numbers. This matrix-type arrangement of contact fields is referred to hereinafter as a contact matrix. The contact fields are coupled via ohmic resistors $R_{q,i,j}$→q, k,l, where $R_{q,i,j}$→q,k,l denote a resistance between contact fields $K_{q,i,j}$ and $K_{q,k,l}$. The resistances of the ohmic resistors include the values $R_{q,i,j}$→q,k,l=0 Ohm (short circuit) to $R_{q,i,j}$→q,k,l→∞ (no electrically conductive connection, i.e., insulator). Contact fields $K_{q,t,u}$ and $K_{q,v,w}$ where (t,u)≠(v,w) are connected to an electric voltage source $U_O$, which generates a potential difference U(t) of any desired variation over time between the contact fields. The electric connections between voltage source $U_O$ and contact fields $K_{q,t,u}$ and $K_{q,v,w}$ are hereinafter denoted as LQ. An electric connection LQ has a number f≧1 of multiply contiguous (in the mathematical sense) electrically conductive and electrically interconnected regions. These regions contain a number g≧0 of electrically conductive regions of resistance heater Hq of a channel q and a number h≧0 of electrically conductive regions of the matrix-type arrangement formed by the contact fields.

Contact fields $K_{q,a,b}$ and $K_{q,c,d}$ with (a,b)≠(c,d) are connected to resistance heater Hq via an electrically conducting connection so that a potential difference between points $K_{q,a,b}$ and $K_{q,c,d}$ causes an electric current to flow through resistance heater Hq if the resistance $R_{H,q}$ of resistance heater Hq has a finite value.

The arrangement composed of voltage source $U_O$, electrical connections LQ, matrix-type arrangement of contact fields, ohmic resistors $R_{q,i,j}$→q,k,l between contact fields $K_{q,i,j}$ and $K_{q,k,l}$ is manipulated, i.e., tuned, according to the present invention so that a heating power $P_q$, which causes a temperature change ΔTq on semiconductor laser Lq due to the thermal coupling of resistance heater Hq to semiconductor laser Lq, is set on electric resistance heater Hq. This temperature change causes a wavelength shift Δλq in the characteristic wavelength of channel q.

Wavelength $\lambda_q$ of channel q is individually set by modifying the resistance of the current conductor and/or the resistor arrangement according to the following procedure:

At the beginning of the procedure, a heating power $P_q$≧0 is set, which results in a wavelength $\lambda_q$. The object is to set the heating power so that the wavelength is $\lambda_{q,s}$.

The heating power of the resistance heater is varied in a range in which the respective variation of the wavelength covers the range of the desired wavelength $\lambda_{q,s}$. A function $\lambda_q(P_q)$ results from this measurement. The heating power $P_q$ for a wavelength $\lambda_{q,s}$ can be determined from this function. The desired heating power $P_q$ can be set by varying the resistance of resistor arrangement RMq and/or the resistance $R_{H,q}$ of the current conductor of the resistance heater.

Heating power $P_q$ can also be varied by setting the voltage at voltage supply $U_O$, in which case, however, the heating power of the other opto-electronic components will also be modified. For example, in the case of resistor arrangement RMq, the size and arrangement of resistors $R_{q,i,j} \rightarrow q,k,l$ is set via the magnitude of the voltage applied at contact fields $K_{q,t,u}$ and $K_{q,v,w}$ and the maximum absolute value of power variation $\Delta\lambda_q = P_{q,max} - P_{q,min}$ of a channel q is set by short-circuiting between the contact fields and by dimensioning the heating resistor $R_{H,q}$ of resistance heater Hq. A maximum wavelength variation $\Delta\lambda_{q,max}$ results from this power variation $\Delta P_q$.

Another option for setting the characteristic wavelength is by setting heating power $P_q$ to a certain value $P \geq 0$ and measuring the corresponding wavelength. Then the heating power is modified on the basis of the stored empirical values for the function $\lambda_q(P_q)$.

It is also contemplated by the present invention to set heating power $P_q$ to two values consecutively and to measure the respective wavelength in each case. The curve $\lambda_q(P_q)$ is then determined by interpolation and/or extrapolation of the previously determined wavelengths and heating power $P_q$ is modified accordingly.

It is also contemplated by the present invention to vary heating power $P_q$ in certain steps $\Delta P$ and to measure the respective wavelengths, in order to establish the function $\lambda_q(P_q)$, and vary heating power $P_q$ using the function thus determined.

Of course, heating power $P_q$ can also be varied continuously until the desired wavelength is attained.

In setting heating power $P_q$, the following conditions are met for the resistances of the connections LQ between voltage source $U_O$ and the matrix-type arrangement of contact fields $K_{q,i,j}$ and $K_{q,k,l}$, as well as the internal resistance of voltage source $U_O$: If, for a component arrangement of n channels with n resistance heaters and n arrangements of contact fields, a number of n−1 resistance heaters H have a heating power $P_{e,min}$ and an arbitrary resistance heater $H_s$ has the heating power $P_s$ with $P_{s,min} < P_s < P_{s,max}$ and $s \neq e$, then the electric connections LQ between voltage source $U_O$ and the contact fields of the individual channels q, as well as the internal resistance of voltage source $U_O$, are dimensioned so that for a variation of the heating power of the n−1 channels by $\Delta P_e$, i.e., from $P_{e,min}$ toward $P_{e,max}$, the heating power of resistance heater $H_s$ is varied by a value $\Delta P_{s,Fehler} < \epsilon_s \cdot \Delta P_s$ with $0 < \epsilon_s < 1$ being a freely selectable value, but one which should be as small as possible in order to minimize the influence of the channels on each other.

Figure 2B:
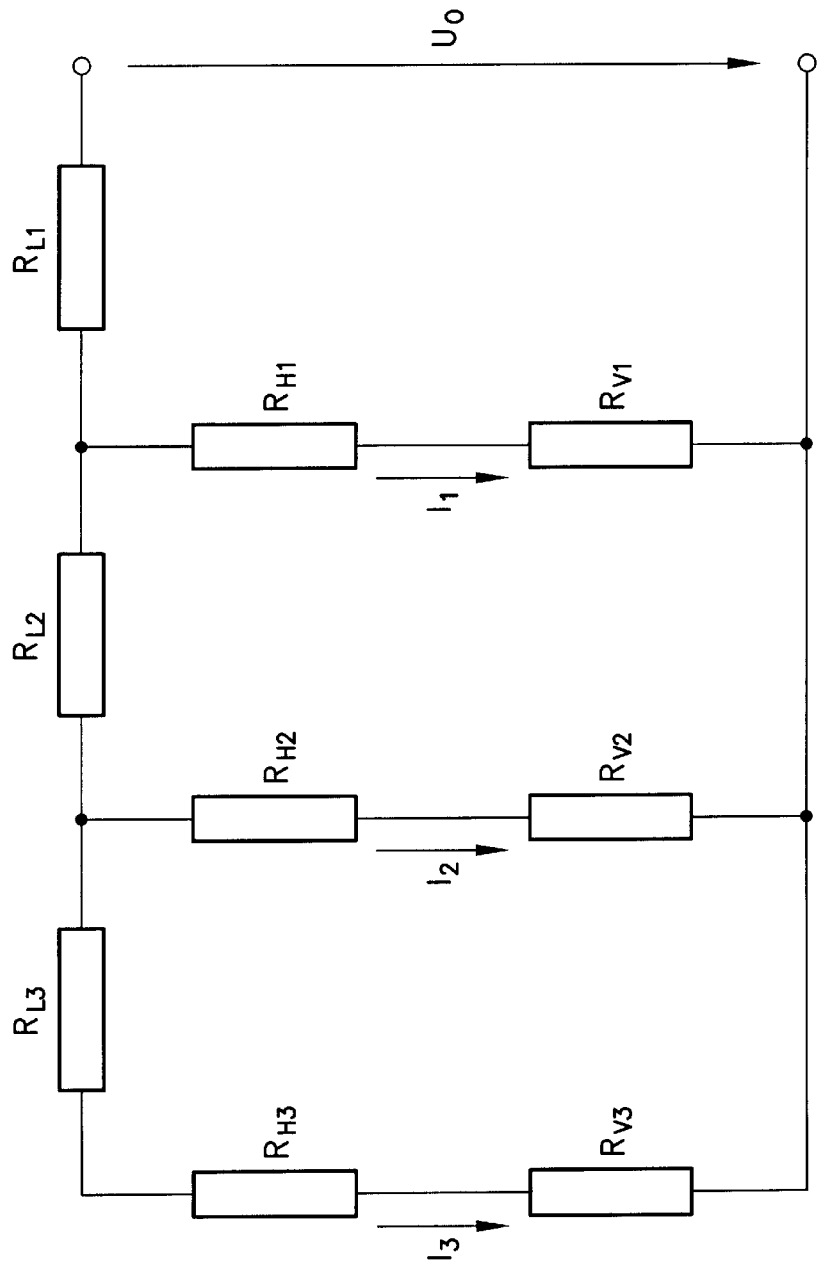
FIG. 2b shows a wiring diagram of a resistance device according to the present invention.

FIG. 2b shows the wiring diagram of an embodiment with three resistance heaters. The matrix-type arrangements of contact fields with resistors $R_{q,i,j} \rightarrow q,k,l$ (q=1,2,3) between the contact fields are configured in this simple case so that they can be combined to form total resistances (hereinafter referred to as series resistors $R_{v1}$–$R_{v3}$, connected in series with heating resistors $R_{H1}$–$R_{H3}$). Electric connections LQ of voltage source $U_O$ with the contact fields to series resistors $R_{v1}$–$R_{v3}$ and heating resistors $R_{H1}$–$R_{H3}$ have a conductor resistance $R_{L1}$–$R_{L3}$. The internal resistance of voltage source $U_O$ is included in resistance $R_{L1}$.

Figure 2C:
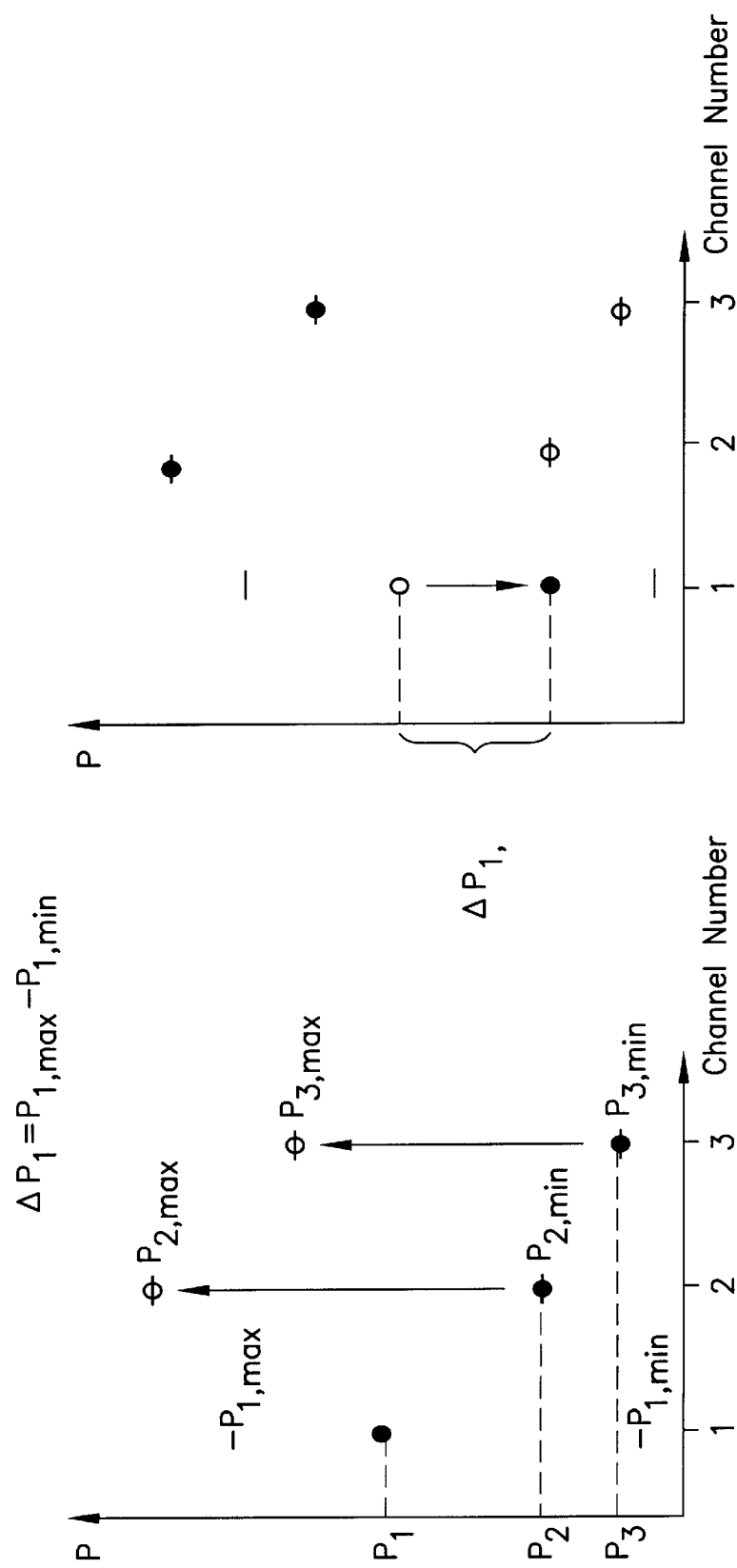
FIG. 2c shows a mutual influence of heating powers of different channels according to the present invention.

The resistance of series resistors $R_{v1}$–$R_{v3}$ and heating resistors $R_{H1}$–$R_{H3}$ are dimensioned according to the required heating powers $P_1$–$P_3$ or the required wavelength shift, and the amount of available voltage $U_O$. Conductor resistances $R_{L1}$–$R_{L3}$ must meet the above requirement. The powers of heating resistors $R_{H1}$–$R_{H3}$ result from:

$$P_q = I_q^2 R_{H,q}$$

with $q = 1,2,3$ $R_{H,q}$ = resistance of the qth heater $H_q$.

and the currents $$I_1 = \frac{U_0}{R_\gamma}\left(1 - \frac{R_{LI}}{R_{ges}}\right)$$

$$I_2 = \frac{U_0}{R_\beta}\left[1 - \frac{R_{LI}}{R_{ges}} - \frac{R_{L2}}{R_{ges}} + 1 - \frac{R_{L2}}{R_\gamma}\left(1 - \frac{R_{LI}}{R_{ges}}\right)\right]$$

$$I_3 = \frac{U_0}{R_\alpha + R_{L3}}\left[1 - \frac{R_{LI}}{R_{ges}} - \frac{R_{L2}}{R_{ges}} + \frac{R_{L2}}{R_\gamma}\left(1 - \frac{R_{LI}}{R_{ges}}\right)\right]$$

and $R_\alpha = R_{L3} + R_{v3} + R_{H3}$ $R_\beta = R_{v2} + R_{H2}$ $R_\gamma = R_{v1} + R_{H1}$ $R_{ges}$ = total resistance FIG. 2c shows the above-mentioned requirement for channel 1. Heating power $P_1$ of channel 1 may have any value within $\Delta P_1$. The remaining channels 2 and 3 have a heating power of $P_{2,min}$ and $P_{3,min}$, respectively. If the heating power of channels 2 and 3 is increased to $P_{2,max}$ and $P_{3,max}$, respectively, the deviation of $P_1$ must be less than $\epsilon_1 \cdot \Delta P_1$.

An appropriate implementation of the above-mentioned embodiments as a component arrangement is illustrated in FIGS. 3 through 11, which are described in more detail in the following.

Figure 3:
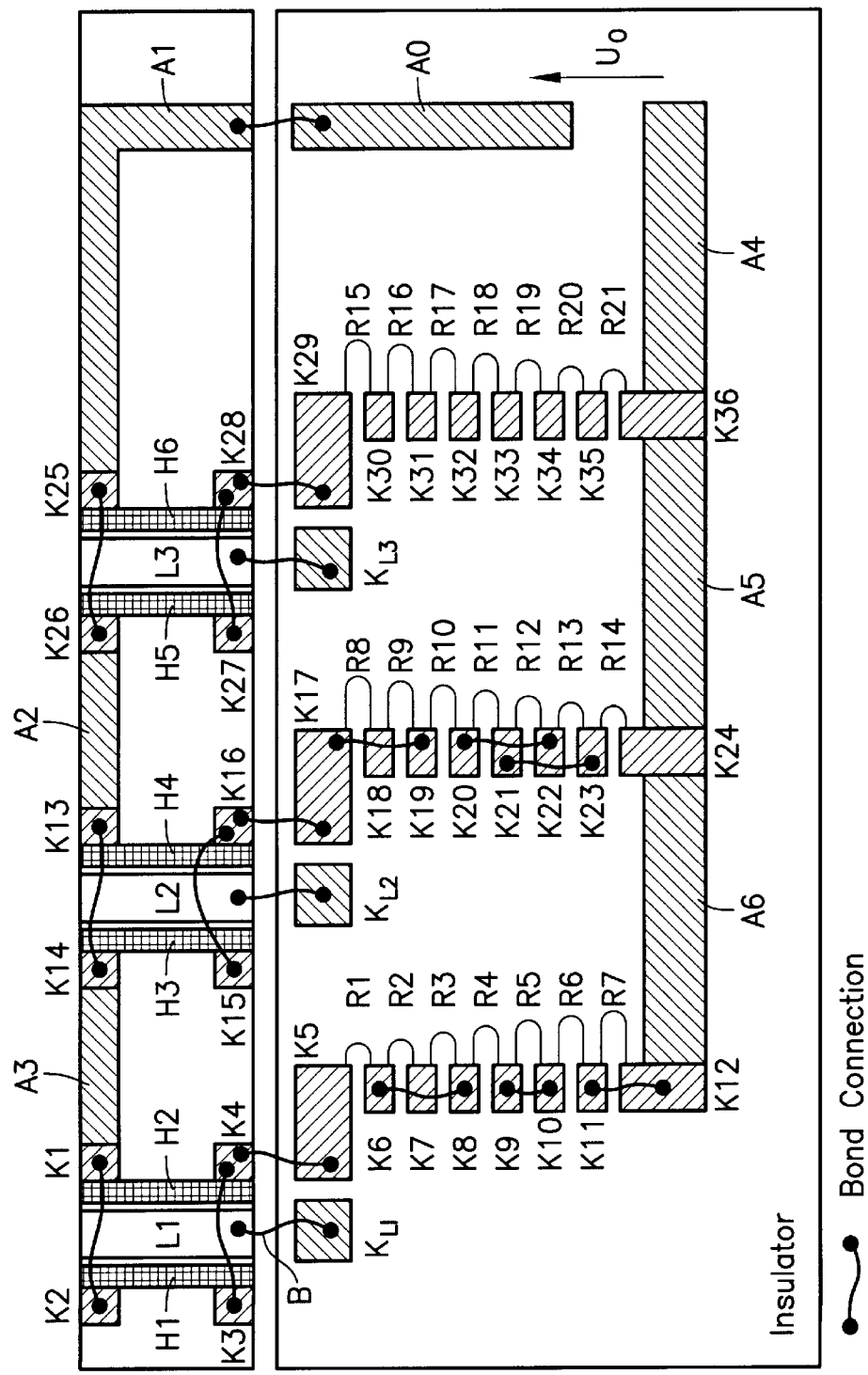
FIG. 3 shows a first embodiment of a component arrangement according to the present invention.

FIG. 3 shows a component arrangement 1 including three components, preferably semiconductor lasers L1, L2 and L3. The arrangement has a two-part structure with the three semiconductor lasers L1 through L3 provided in the first part. Furthermore, the first part of the arrangement includes resistance heaters H1 through H6 and a part of the contact matrix (K1–K4, K13–K16, K25–K28), with H1, H2 and K1–K4 assigned to channel 1, H3, H4 and K13–K16 being assigned to channel 2, and H5, H6, as well as K25–K28 being assigned to channel 3. Resistance heaters H1 through H6 are arranged so that they are in thermal contact with their respective semiconductor lasers L1 through L3.

The second part of the structure has an insulator, on which the second part of the contact fields of the contact matrix (K5 through K12 for channel 1, K17 through K24 for channel 2 and K29 through K36 for channel 3) is located for each channel, i.e., for each semiconductor laser L1 through L3. In the present case, the contact matrix is a unidimensional matrix with twelve fields. Leads LQ to voltage source $U_O$ are located on the upper edge of the laser array and on the lower edge of the contact array. The leads include the areas: A0, B, A1, K25, B, K26, A2, K13, B, K14, A3, K1, B, K2 on the upper edge of the component arrangement of part 1 and the areas A4, K36, A5, K24, A6, and K12 on the lower edge of the insulator.

Thus the leads contain zones of the contact matrices.

In addition to the contact matrices, other contact fields $K_{L1}$ through $K_{L3}$, are located on the contact arrangement, which are connected to the contacts of the respective semiconductor lasers L1–L3 via electrically conductive bond connections B.

Contacts K5 through K12 of channel 1, K17 through K24 of channel 2 and K29 through K36 of channel 3 of the contact matrices are electrically conductively connected via spatially distributed resistor arrangements R1–R7, R8–R14, and R15–R21. FIG. 3 shows the resistor arrangements as black loops. Contact field K4 is electrically connected to contact field KS via a bond connection; the same is true for K16 and K17, as well as K28 and K29. The supply voltage of resistance heaters H1–H6 is applied between areas A4 and AO, which is indicated by an arrow.

The individual resistance heaters H1–H6 are set to a certain heating power $P_q$ by changing the resistances between the contacts of the contact matrix, which can be achieved through additional electric connections or by changing the loop-type resistor arrangements.

The heating power is varied as required during the tuning process using a variable voltage at voltage source $U_O$.

Figure 4A:
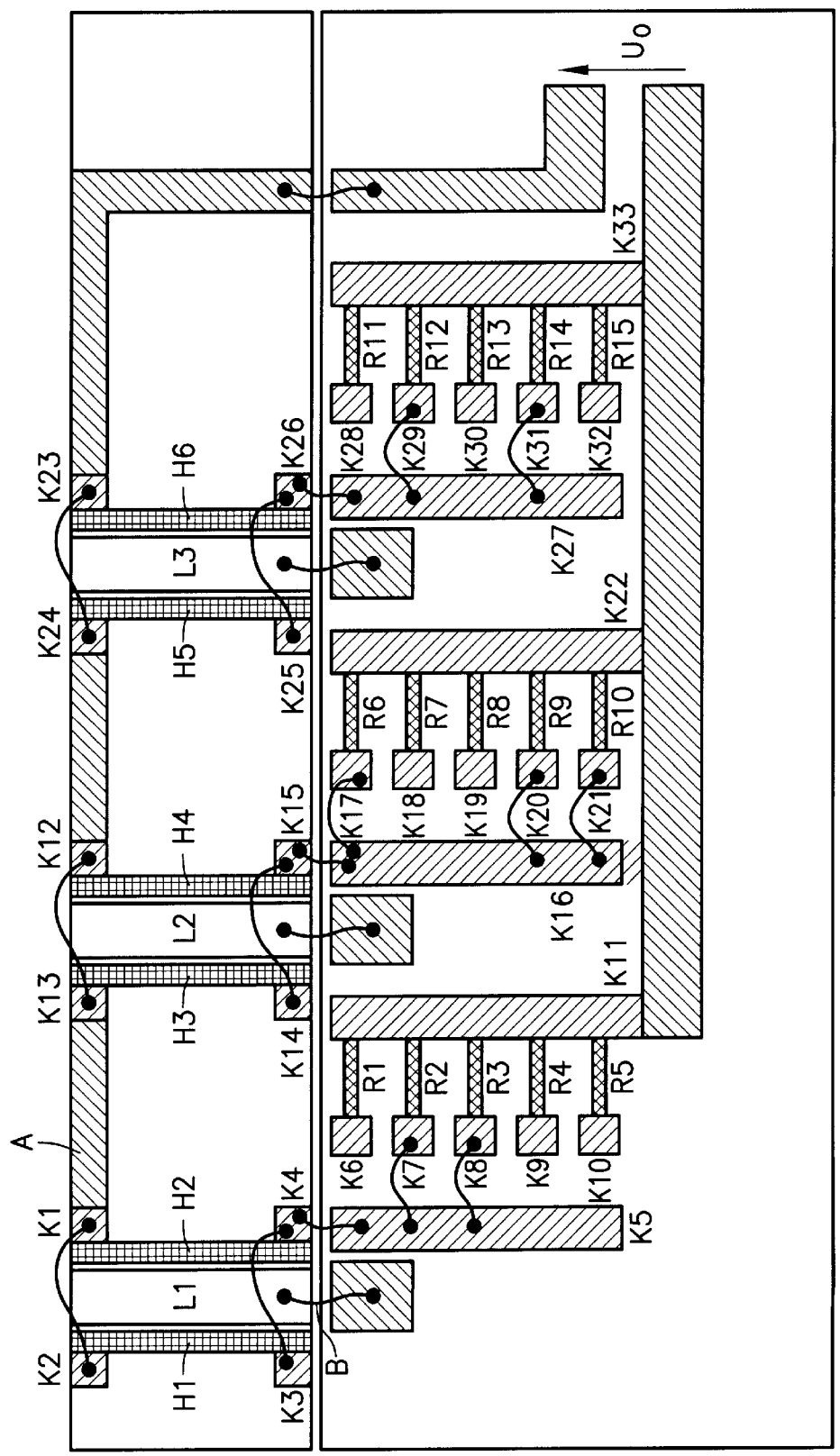
FIG. 4a shows another embodiment of a component arrangement according to the present invention.

The exemplary embodiment illustrated in FIG. 4a basically follows the example of FIG. 3. It differs from it by the arrangement of the contact matrices, which in this case each have 11 contact fields (K1 through K11 for channel 1, K12 through K22 for channel 2, and K23 through K33 for channel 3). Ohmic resistors having the values shown below are located between contact field K11 and contact fields K6 through K10, K22 and K17 through K21, as well as K33 and K28 through K32.

$$R1=R6=R11=1/1 \cdot R$$
$$R2=R7=R12=1/2 \cdot R$$
$$R3=R8=R13=1/4 \cdot R$$
$$R4=R9=R14=1/8 \cdot R$$
$$R5=R10=R15=1/16 \cdot R$$

with resistance R being determined by the maximum and minimum resistances to be set.

Figure 4B:
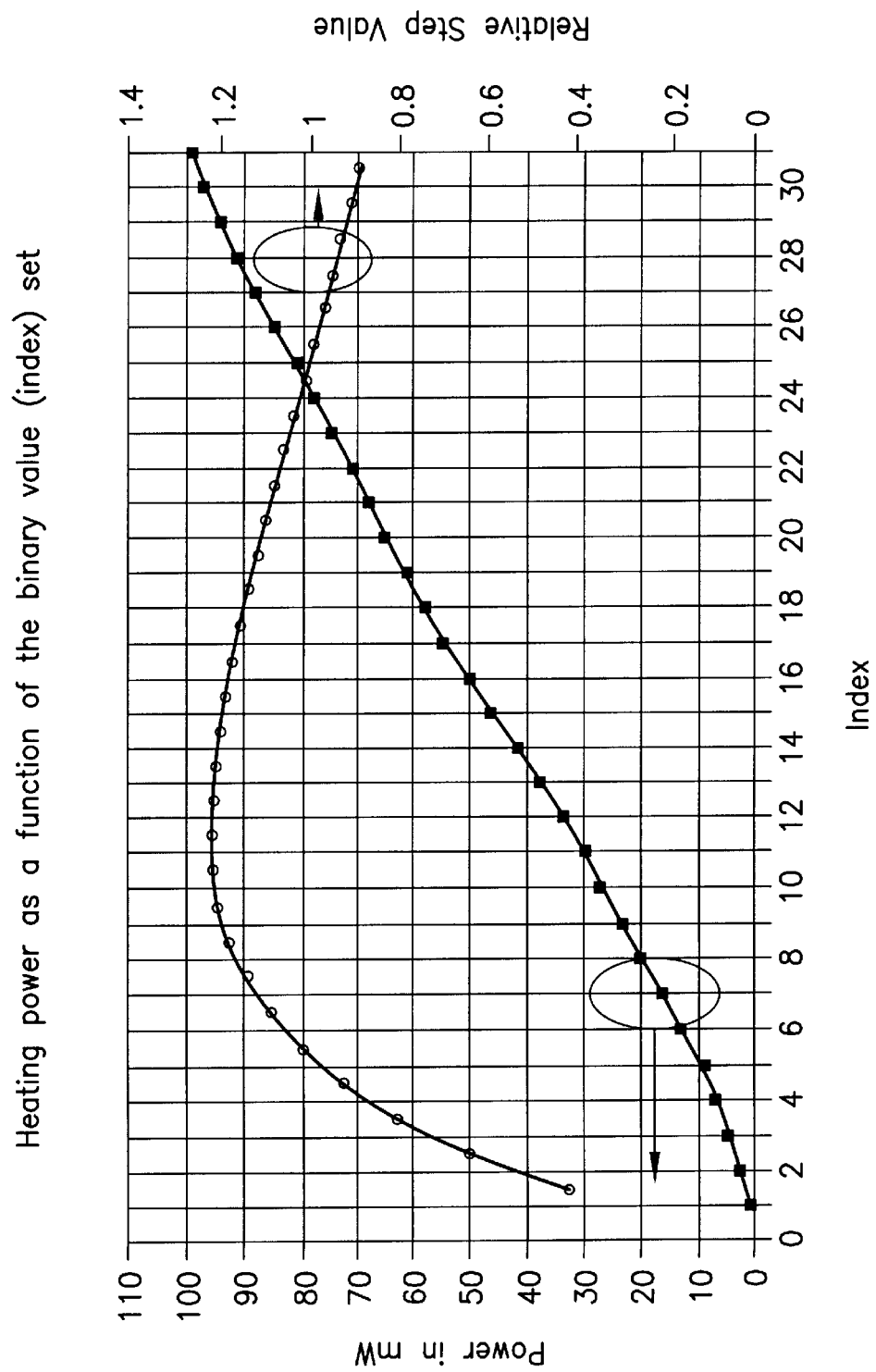
FIG. 4b shows a first diagram to determine a heating power according to the present invention.

Thus this is a binary coding of the resistance values with which a resistance range of R through $R/2^i$ can be spanned with i being the number of resistors per channel. Thus, with five resistors, thirty-one different resistance values can be set by establishing electrically conductive connections from contact field K5 to contact fields K6 through K10 for channel 1, for example. If the resistance $1/6 \cdot R$ is to be set for channel 1, for example, resistor $R2=1/2 \cdot R$ is to be connected in parallel to resistor $R3=1/4 \cdot R$ as shown in FIG. 4a for semiconductor laser L1. A resistance of $1/25 \cdot R$ is to be set for semiconductor laser L2 and a resistance of $1/10 \cdot R$ is to be set for semiconductor laser L3. If $U_O=2.5$ V, R=480 Ohm, and $R_H=20$ Ohm, the variation of the heating power (left-hand ordinates) as a function of the index set is shown in FIG. 4b. The resistance results in $R_{res}=R/Index$. The power is calculated by the formula:

$$P(R) = \frac{U_0^2}{(R_{res}+R_H)} R_H$$

where $R_{res}$ being the resulting resistance.

The relative step width is plotted on the right-hand ordinates of FIG. 4b. A relative step width of one corresponds to the linear function between heating power and the index set. A good agreement with linear variation is achieved by properly dimensioning heating resistors H1–H6, voltage $U_O$ and resistor R.

Figure 4C:
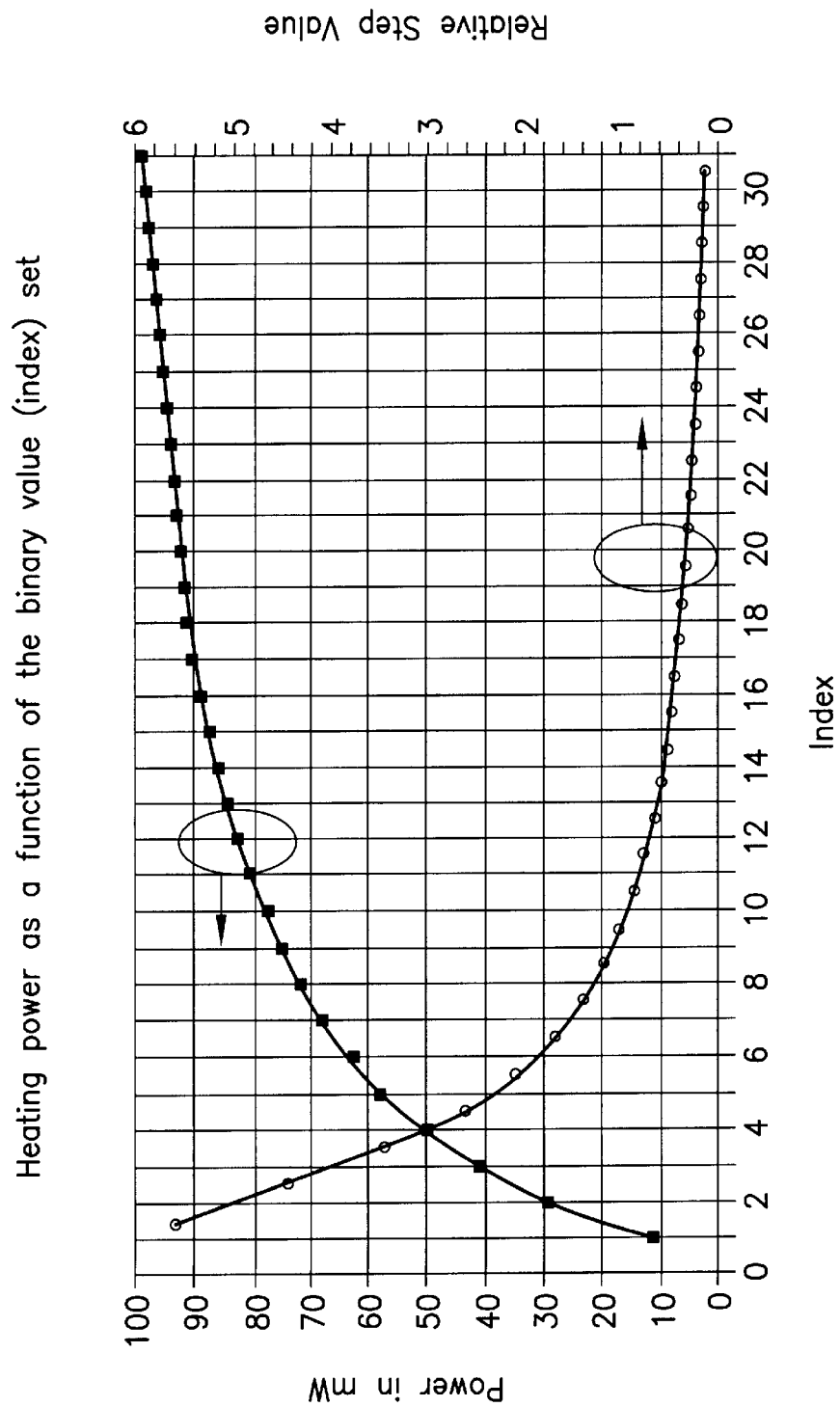
FIG. 4c shows a second diagram to determine the heating power according to the present invention.
Figure 4D:
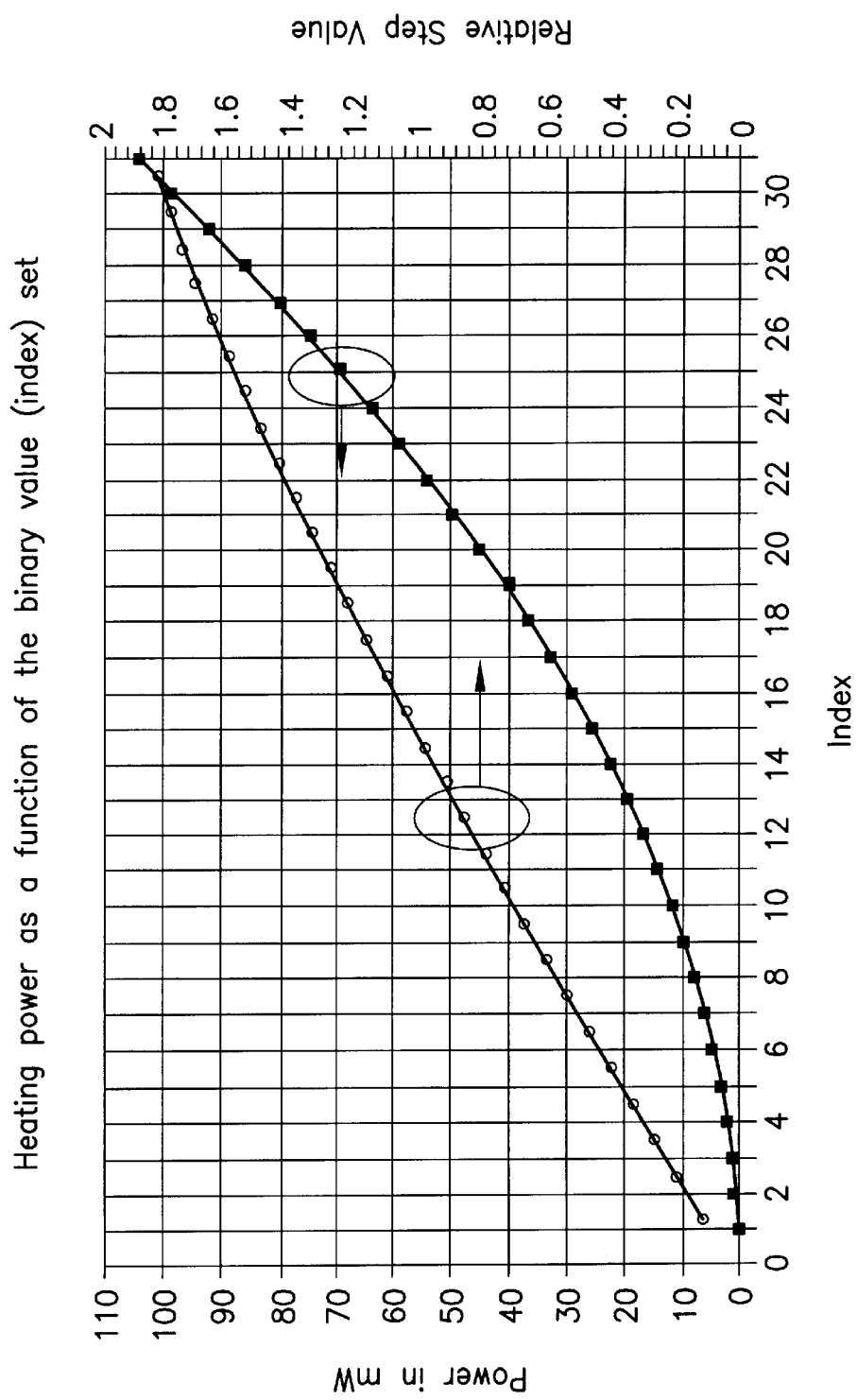
FIG. 4d shows a third diagram to determine the heating power according to the present invention.

It can be advantageous to set heating power $P_q$ in very small (large) step widths, for example, for high heating powers, as shown in FIG. 4c (FIG. 4d), through the selection of the supply voltage and of the value of R. In the case of large step widths for high heating powers (FIG. 4d), the heating voltage is 20 V and the resistance for R=8 kOhm. In the case of small step widths for high heating powers, the heating voltage is 1.5 V and the resistance for R=40 Ohm.

Figure 5A:
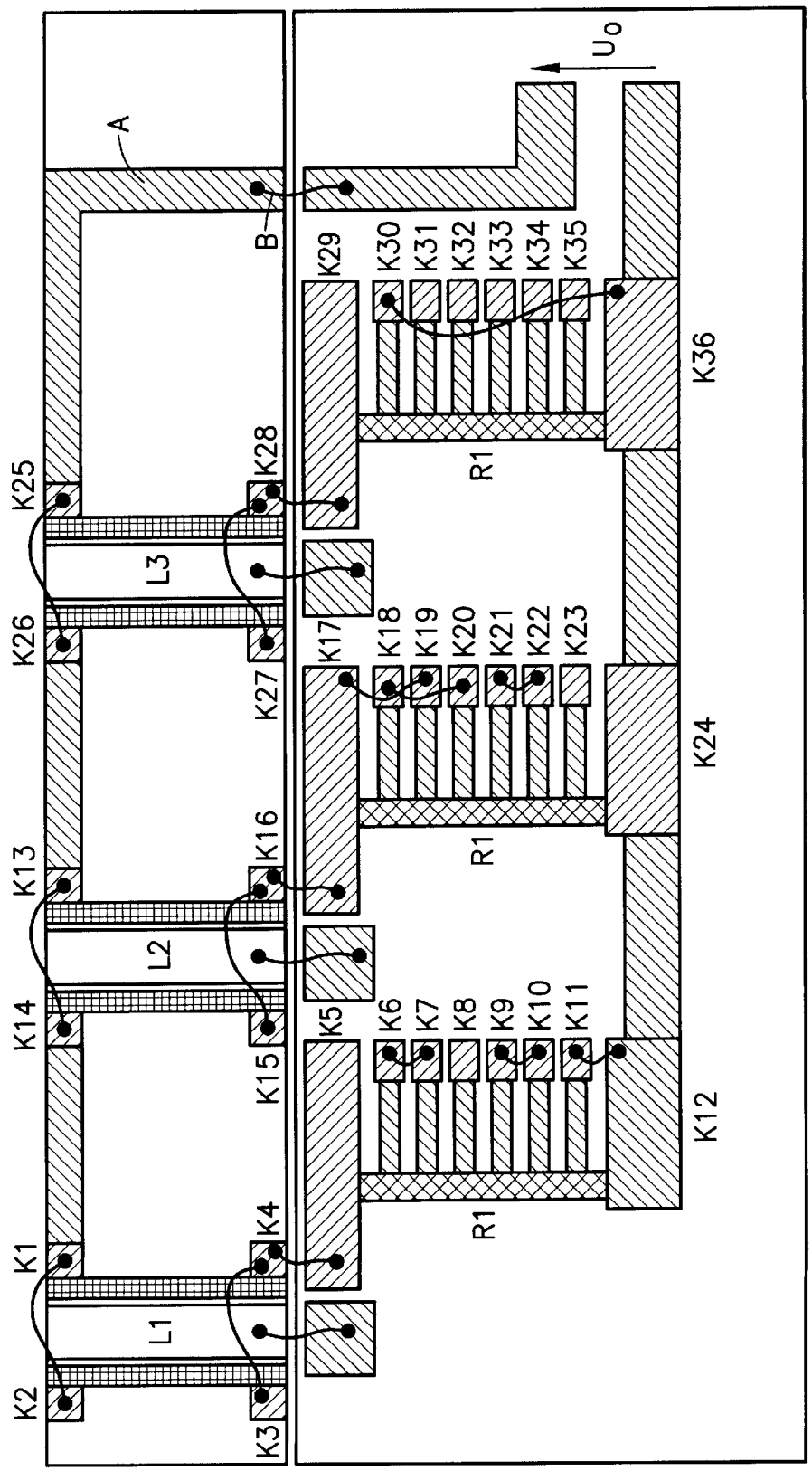
FIG. 5a shows another embodiment of a component arrangement according to the present invention.

FIG. 5a shows a variation of FIG. 3. The loop-shaped resistors of FIG. 3 are designed as straight-line resistor arrangements RI in FIG. 5a. Contact fields K5 through K12 tap resistor RI, for channel 1, for example, at different points. Also in this example, the resulting resistance values can be binary coded as long as the resistances between two adjacent contact fields K5 through K12 for channel 1, K17 through K24 for channel 2, and K29 through K36 for channel 3, are dimensioned as shown for channel 1 as an example.

R1=resistance between K5 and K6=R
R2=resistance between K6 and K7=R·2
R3=resistance between K7 and K8=R·4
R4=resistance between K8 and K9=R·8
R5=resistance between K9 and K10=R·16
R6=resistance between K10 and K11=R·32
R7=resistance between K11 and K12=R·64

For example, for semiconductor laser L1, a resulting resistance of R1+R3+R4+R6 is obtained. The procedure is analogous for the remaining channels.

Figure 5B:
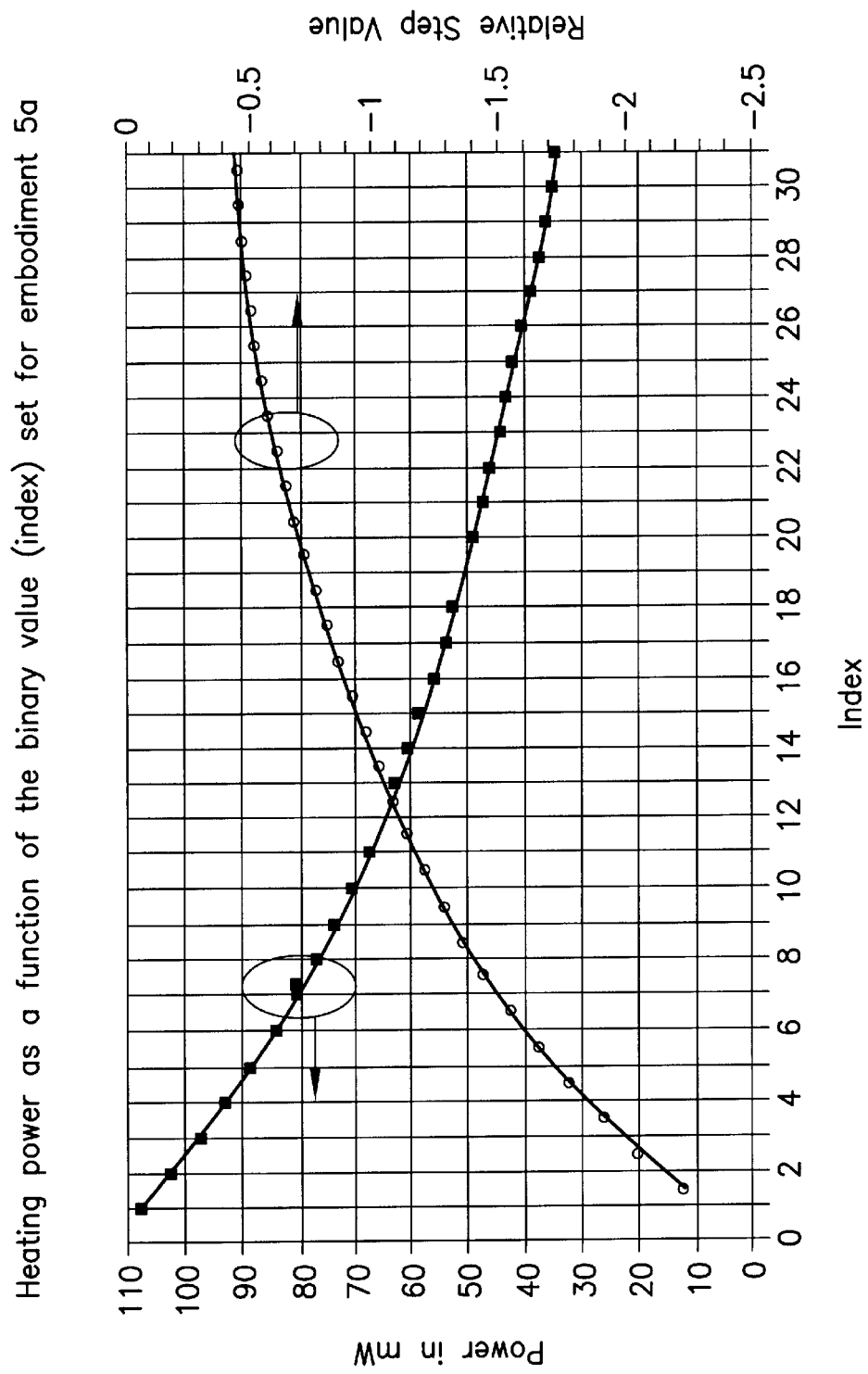
FIG. 5b shows a diagram for calculating the heating power according to the present invention.

FIG. 5b shows the variation of power in the case of binary coding. Using channel 2, it is shown how other total resistance values can be achieved through connections between contact fields K17 and K19, as well as K18 and K20, that intersect at any desired manner.

Figure 6:
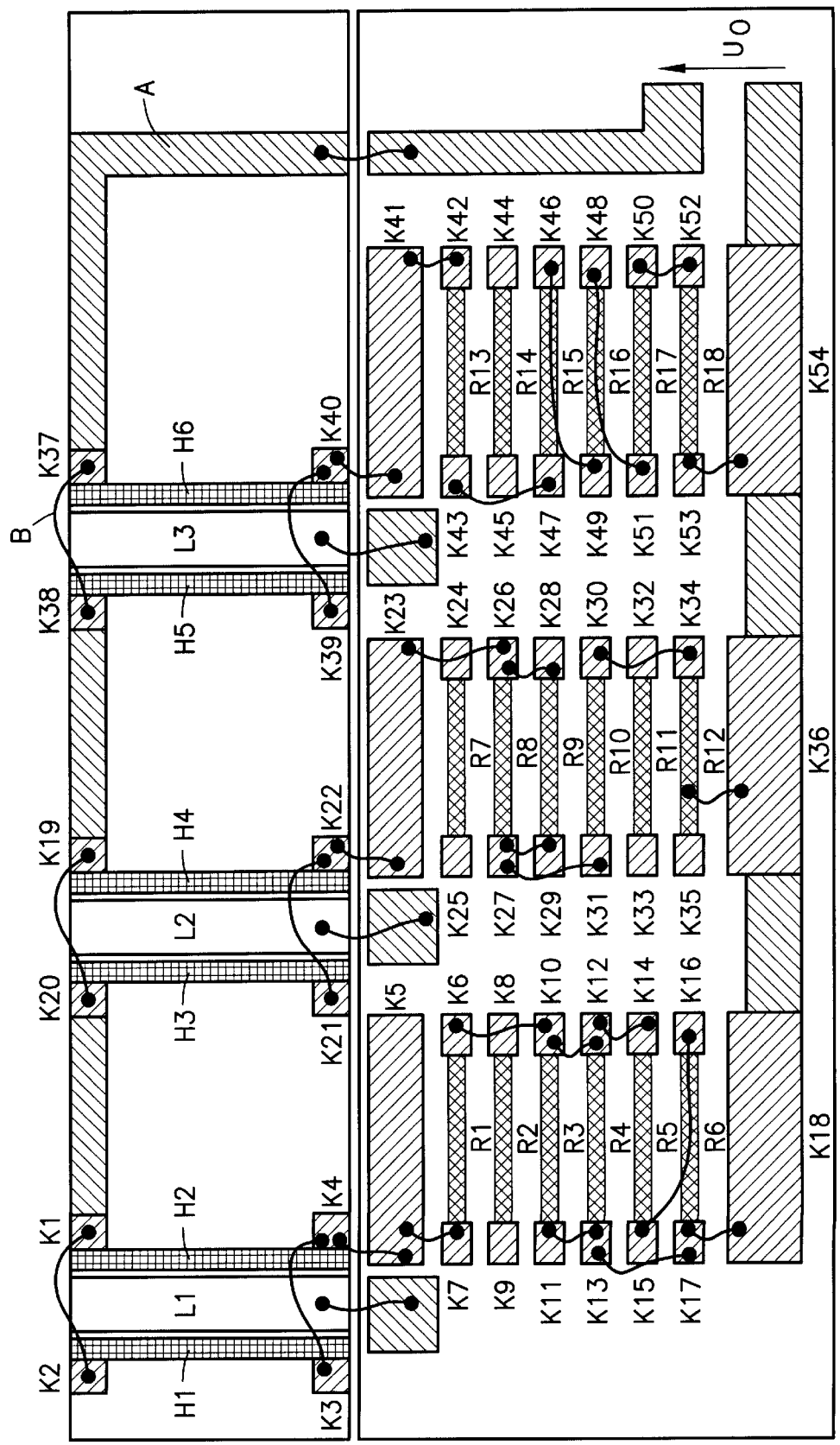
FIG. 6 shows another embodiment of a component arrangement according to the present invention.

FIG. 6 shows another embodiment of a component arrangement, where six resistors are available per channel (R1 through R6 for channel 1; R7 through R12 for channel 2; and R13 through R18 for channel 3) for setting heating power $P_q$.

The resistors can be connected to one another in any desired manner through contact fields K5 through K18 (for example, for channel 1).

Figure 7:
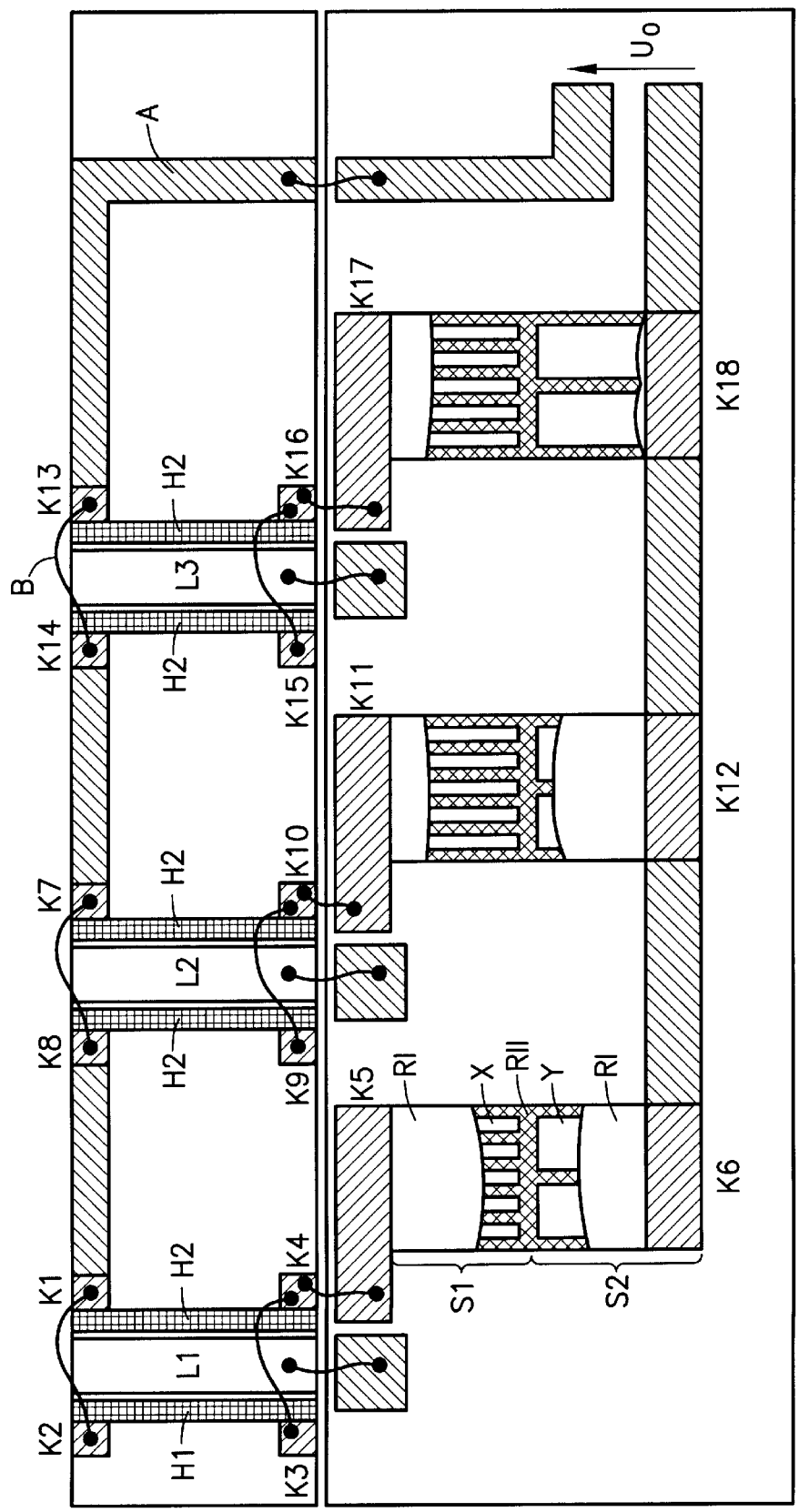
FIG. 7 shows another embodiment of a component arrangement according to the present invention.

The contact matrix illustrated in FIG. 7 has six contact fields per channel. Fields K5 and K6 (for channel 1) are connected together in an electrically conductive manner via a tunable resistance arrangement. The resistance arrangement has two regions S1 and S2, which in turn have a region with electrically conductive material X (shaded) and an insulating region with an insulator Y (white). By applying a highly conductive material (black), for example, solder, to regions S1 and S2, the total resistance between the contact fields is reduced. Area S2 is used for rough setting and area S1 is used for fine-tuning the heating power.

Figure 8:
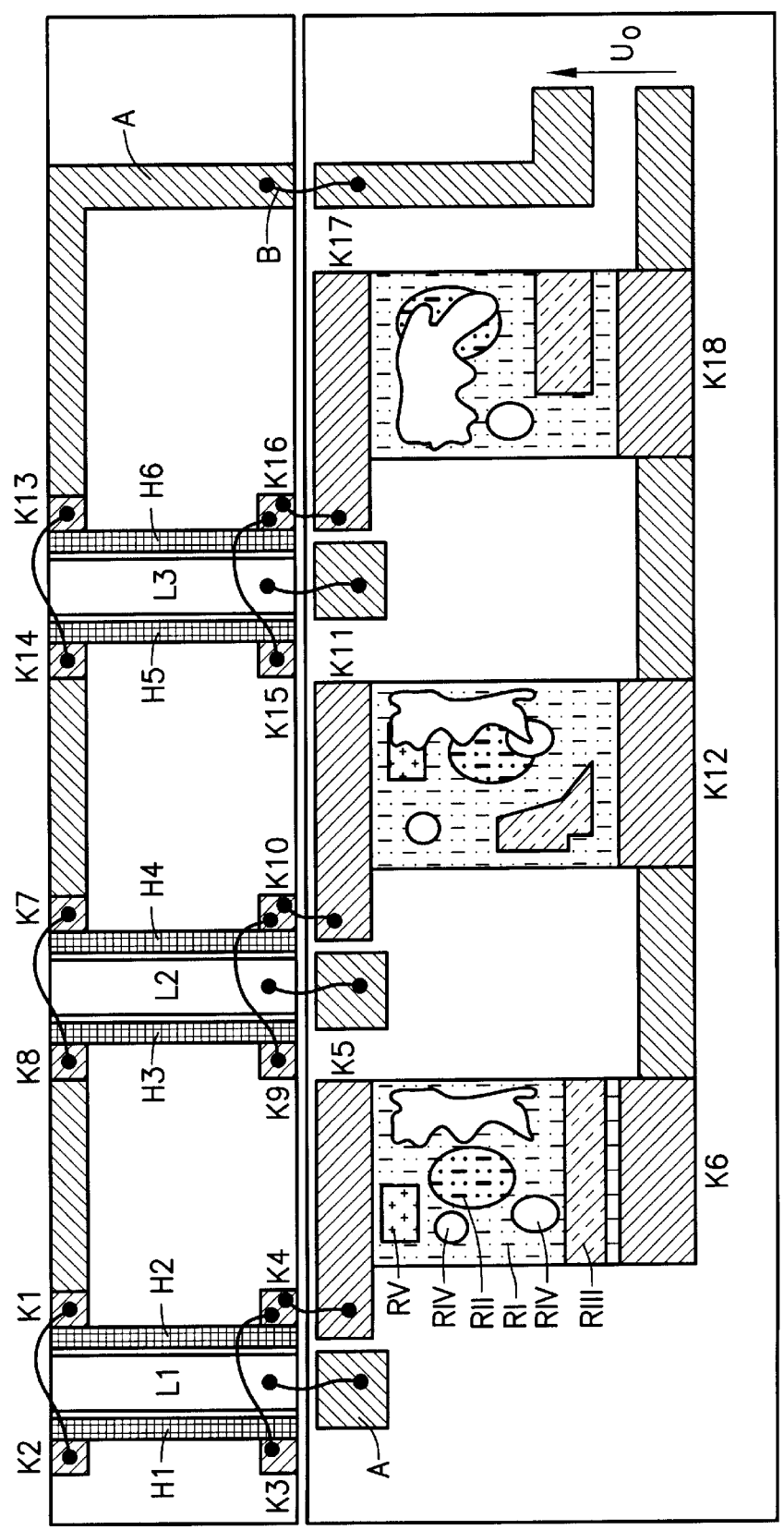
FIG. 8 shows another embodiment of a component arrangement according to the present invention.

The embodiment illustrated in FIG. 8 is modified with respect to that of FIG. 7 in that tuning is performed by modifying the resistance of regions of any desired shape, represented as differently marked areas and having electric conductivities (RI through RV), on resistor arrangement RM. These resistors RI–RV are made of different resistor materials. The resistances of resistors RI–RV can be set to the desired values by selectively changing the material, preferably by removing material or applying material. Material removal and application can be performed by laser ablation, for example. Furthermore, the resistances of resistors RI–RV can also be changed via chemical or electrochemical treatment. Other options for modifying the resistance include influencing by particle implantation, electromagnetic radiation, and particle bombardment or electric signals.

Figure 9:
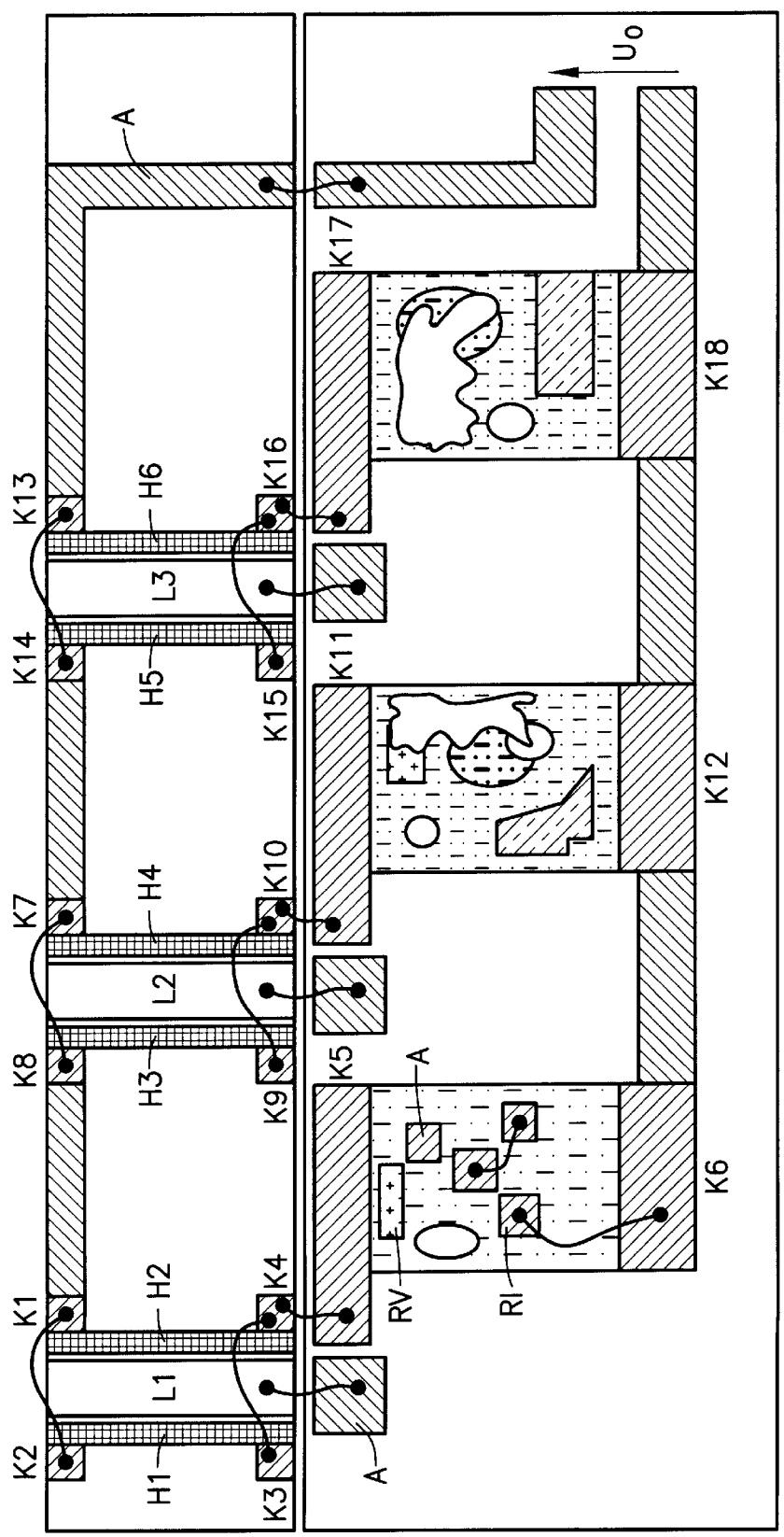
FIG. 9 shows another embodiment of a component arrangement according to the present invention.

The embodiment illustrated in FIG. 9 differs from that of FIG. 8 in that any desired electric connections are established between resistors of any desired shape and made of different resistor materials. The connections may be bond connections B, for example. Tuning is performed by applying or removing bond connections or alternatively by the procedure described for FIG. 8.

Figure 10:
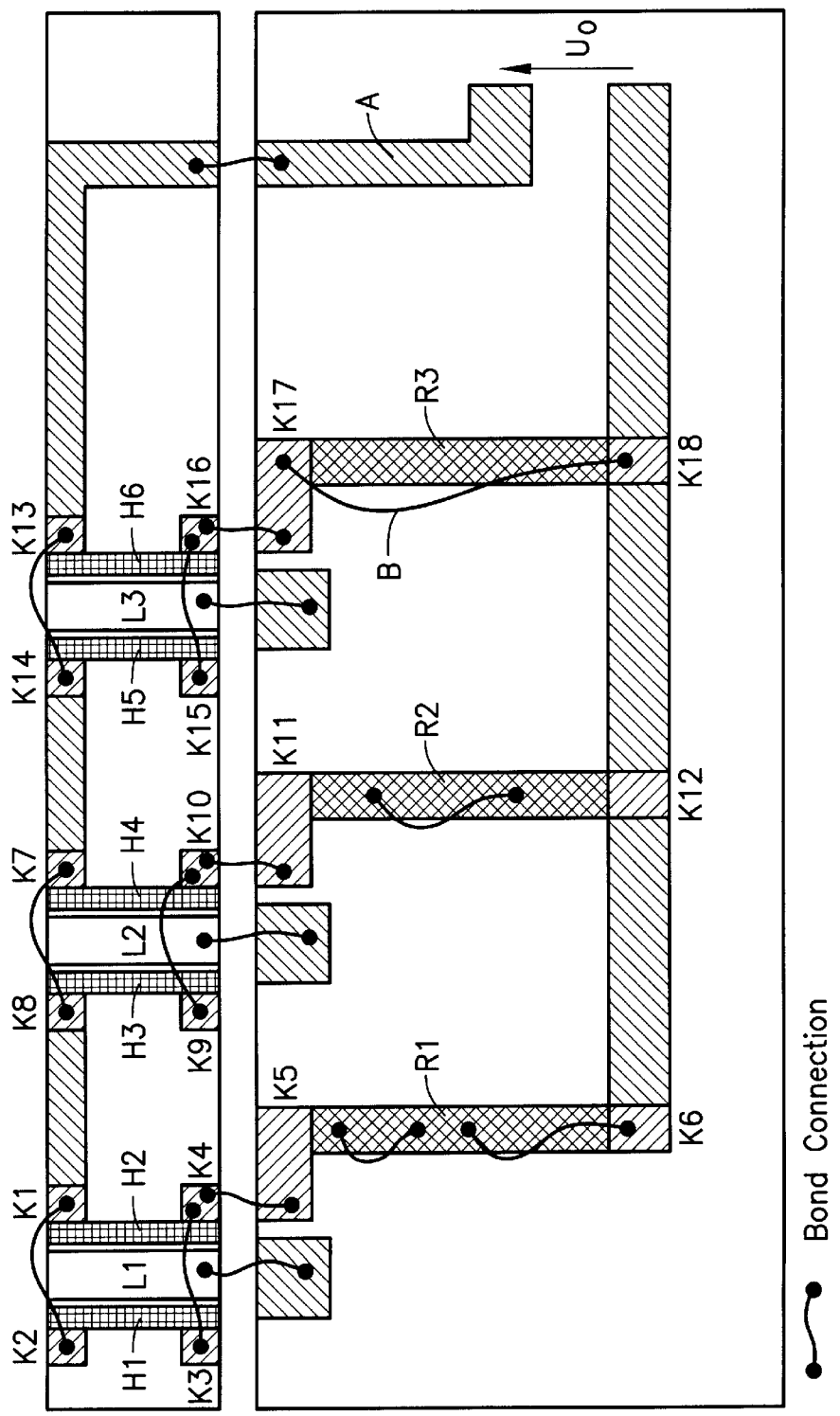
FIG. 10 shows another embodiment of a component arrangement according to the present invention.

In the embodiment illustrated in FIG. 10, resistor arrangements RM are formed for the three channels by resistors R1 through R3. Tuning is performed by applying electrically conductive connections, for example, bond connections B with a high electric conductivity compared to resistor arrangement RM.

Figure 11:
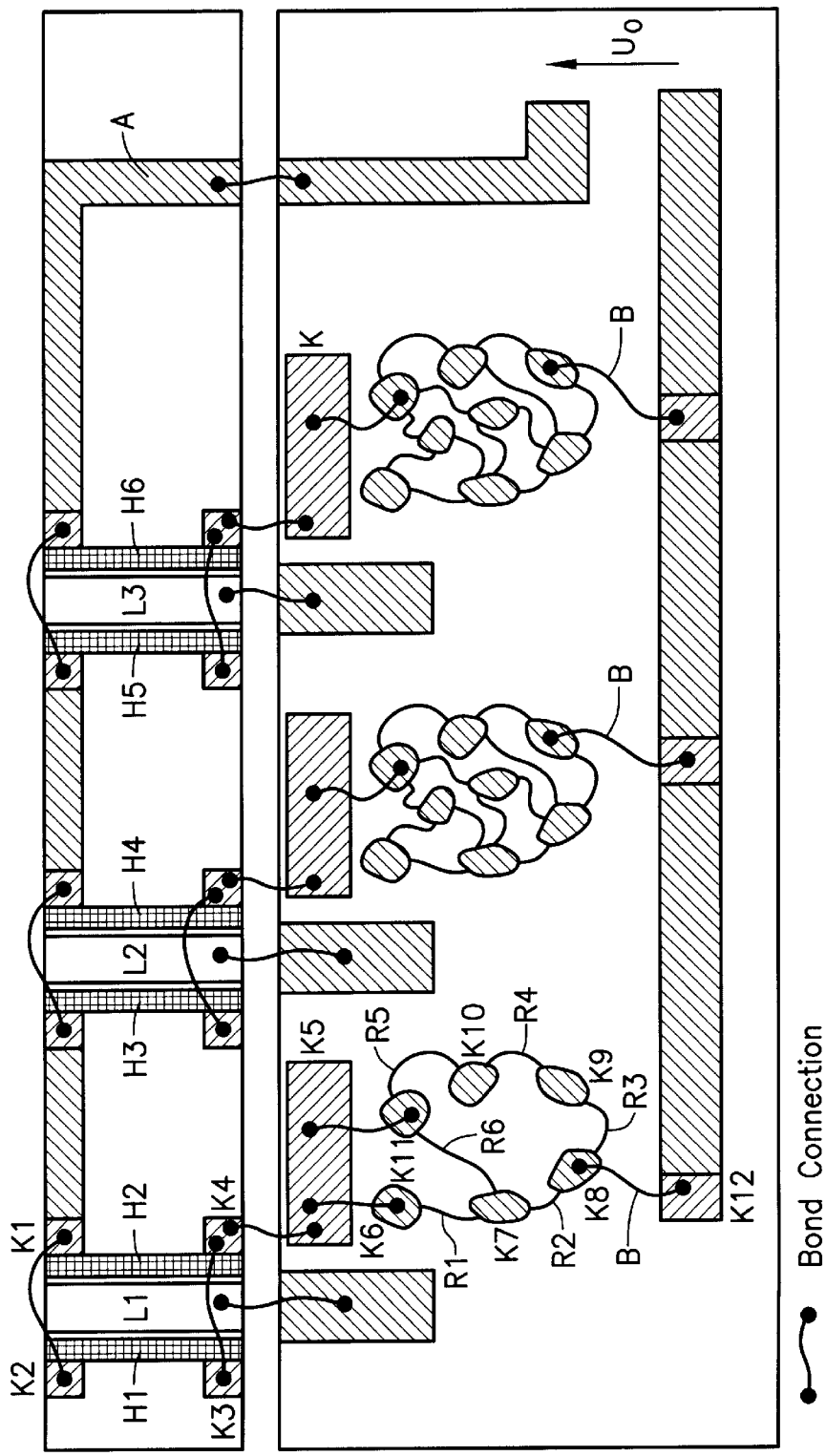
FIG. 11 shows another embodiment of a component arrangement according to the present invention.

FIG. 11 shows another embodiment in which the contact matrix for channel 1 includes contact fields K1 through K12. Electrically conductive connections R1 through R6, which are represented by curved lines in FIG. 11, are located between contact fields K6 and K11. The total resistance of the contact matrix is tuned by additional electric connections, designed as bond connections B.

Figure 12A:
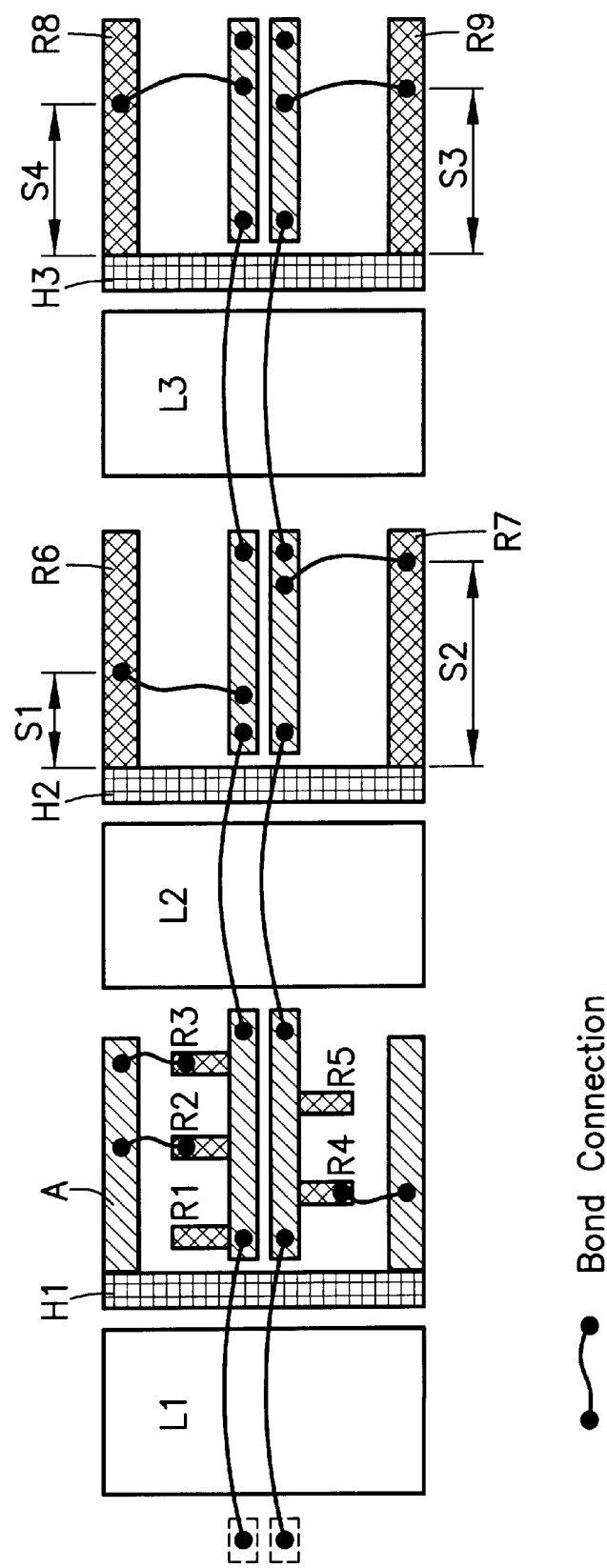
FIG. 12a schematically shows a component arrangement with a resistor arrangement used for heating according to the present invention.

The above-mentioned procedures for modifying the resistance of the current conductor of the resistance heater and for modifying the resistance within resistor arrangement RM can be used individually or in any combination for tuning a semiconductor laser. In addition, the above-described resistance arrangement RM can also be brought into thermal contact with the semiconductor lasers, so that resistor arrangement RM is used as an additional heater for further heating the semiconductor lasers, as schematically shown in FIG. 12a.

Figure 12B:
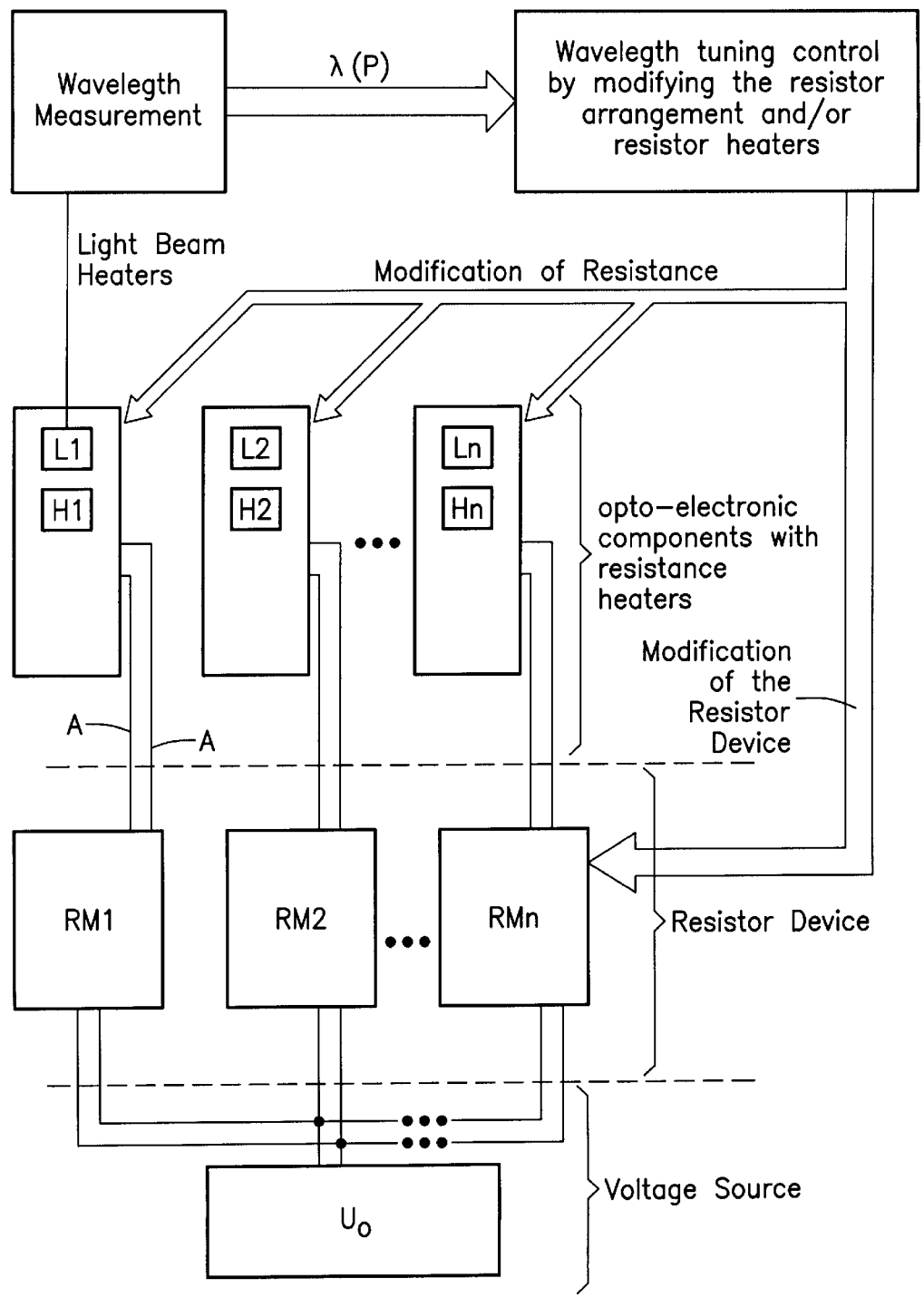
FIG. 12b shows a diagram to illustrate a method according to the present invention.

The above-described procedure for tuning semiconductor laser L is now briefly described again referring to FIG. 12b. Thus, initially, a certain heating power P≧0 is set via voltage source $U_O$ or, as an alternative, via resistance arrangement RM1–RMn individually for each semiconductor laser L1 through Ln. Then the wavelength is measured for each semiconductor laser L1 through Ln. Using the function λ(P), the resistance of the electric conductors (resistance heater H1–Hn) associated with the respective semiconductor lasers L1–Ln is modified by one of the above-described methods. Depending on the procedure selected, these steps are performed again until the desired characteristic wavelength is attained.

From the above-mentioned embodiment it can be seen that there are a plurality of options for individually setting the heating power of the individual resistance heaters in a simple manner by modifying the material of the current conductor and/or of a resistor arrangement without using more than one voltage source $U_O$. In particular, the resistances of both resistor arrangements RM1–RMn and of resistance heaters H1–Hn can be modified at any time, i.e., also after the component arrangement has been put in service. Thus, it is contemplated by the present invention to check the wavelength or the heating power $P_q$ in regular intervals using time and temperature measurements on the basis of empirical values, for example, in order to compensate for aging effects.

In addition, the present invention can also be used not only for the above-described semiconductor lasers L1–Ln, but in general for opto-electronic components such as optical amplifiers, filters, wavelength multipliers, or optical fibers.

In the above exemplary embodiments, a voltage source $U_O$ is used as the power supply device. Of course, a current source I can also be used as shown in FIG. 13, in which case resistor arrangement RM1–RM3 and resistance heaters H1–H3 are connected in parallel rather than in series.

List of Reference Symbols Used

L1–Ln semiconductor laser
$U_O$ voltage source
I current source
H resistance heater
H1–Hn resistance heaters of the semiconductor laser
$H_q$ resistance heater of a channel q
$R_{H,q}$ resistance of the resistance heater of a channel q
$P_q$ heating power of the resistance heater of a channel q
LQ electrical connections of voltage source $U_O$ to the contact fields of the individual channels q
$R_{q,i,j}$–$R_{q,k,l}$ resistances of the resistance heaters
$R_{v1}$–$R_{v3}$ serial resistors
$R_{L1}$–$R_{L3}$ conductor resistances of $R_q$
RM resistor arrangement
RM1–RMn resistance arrangements of the opto-electronic components
R1–Rn resistances of the resistor arrangements
RI–RXVII resistances of the resistor arrangements made of different resistor materials
A1–An connections and conductive areas that are not actually resistors
B bond connections
K1–Kn contact fields (bond pads)
$K_{L1}$–$K_{L3}$ contact fields
$K_{q,a,b}$–$K_{q,v,w}$ contact fields
x,y point coordinates
S1; S2 path

What is claimed is:
1. A method of wavelength tuning an opto-electronic component arrangement, the opto-electronic component arrangement including at least two opto-electronic components, comprising the steps of:

thermally setting a characteristic wavelength for each of the at least two opto-electronic components via a separately assigned resistance heater;

determining a wavelength deviation by comparing a measured wavelength with the characteristic wavelength; and performing a thermal modification of the separately assigned resistance heater by selectively modifying at least one of (A) a resistance of a conductor of the separately assigned resistance heater and (B) a resistance of a resistor arrangement connected upstream from the separately assigned resistance heater.

2. The method according to claim 1, wherein selectively modifying includes the step of modifying by material modification the resistance of at least one of the conductor of the separately assigned resistance heater and the resistor arrangement.

3. The method according to claim 2, wherein the step of modifying by material modification includes the step of at least one of removing material and applying material.

4. The method according to claim 1, wherein selectively modifying includes the step of using laser ablation.

5. The method according to claim 1, wherein selectively modifying includes the step of heat treating.

6. The method according to claim 1, wherein selectively modifying includes the step of at least one of chemically treating and electrochemically treating.

7. The method according to claim 1, wherein selectively modifying includes the step of using at least one of particle implantation, electromagnetic radiation and particle bombardment.

8. The method according to claim 1, wherein selectively modifying includes the step of using an electric signal.

9. The method according to claim 1, wherein selectively modifying the resistance of the resistor arrangement includes the step of using circuit technology resources.

10. The method according to claim 1, wherein the method is performed in regular time intervals.

* * * * *